US009686883B2

(12) United States Patent
Butterbaugh et al.

(10) Patent No.: US 9,686,883 B2
(45) Date of Patent: Jun. 20, 2017

(54) MODULAR ELEMENTS EMPLOYING LATCHES WITH FLEXURE BEARINGS

(71) Applicant: International Business Machines Corporation, Armonk, NY (US)

(72) Inventors: Matthew A. Butterbaugh, Rochester, MN (US); Eric A. Eckberg, Rochester, MN (US); Camillo Sassano, Durham, NC (US); Kevin L. Schultz, Raleigh, NC (US); Scott A. Shurson, Mantorville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 177 days.

(21) Appl. No.: 14/584,613

(22) Filed: Dec. 29, 2014

(65) Prior Publication Data

US 2016/0192529 A1    Jun. 30, 2016

(51) Int. Cl.
*H05K 5/00* (2006.01)
*H05K 7/14* (2006.01)
*H05K 5/02* (2006.01)

(52) U.S. Cl.
CPC ......... *H05K 7/1489* (2013.01); *H05K 7/1409* (2013.01); *H05K 7/1487* (2013.01);
(Continued)

(58) Field of Classification Search
CPC .. H05K 5/0221; H05K 7/1409; H05K 7/1489; H05K 7/1401; H05K 7/1488; Y10T 292/0886
(Continued)

(56) References Cited

U.S. PATENT DOCUMENTS 5,928,016 A * 7/1999 Anderson ............ H05K 7/1411
361/801
6,252,765 B1 * 6/2001 Balzaretti ............... G06F 1/184
361/679.42
(Continued)

FOREIGN PATENT DOCUMENTS

JP    2003298251 A    10/2003

OTHER PUBLICATIONS

International Business Machines Corporation, U.S. Appl. No. 14/587,115, filed Dec. 31, 2014, 29 pages.
(Continued)

*Primary Examiner* — James Wu
(74) *Attorney, Agent, or Firm* — Patterson + Sheridan, LLP

(57) ABSTRACT

Modular elements employing latches with flexure bearings are disclosed. A modular element may include a chassis body supporting electronic components. The body is in communication with a latch and a control member of the modular element. The modular element is removable from or secured to an enclosure using the latch. The latch may engage the enclosure and may remain engaged by being secured by interfacing with a catch of an arm of the control member. By connecting the arm to the control body with a flexure bearing, the flexure bearing may urge the catch into a detent of the latch to secure the latch and keep the modular element secured to the enclosure. The latch may be disengaged from the control member by removing the catch from the detent. In this manner, the modular element is efficiently secured and removed from the enclosure.

18 Claims, 5 Drawing Sheets

(52) U.S. Cl.
CPC ......... *H05K 5/0221* (2013.01); *H05K 7/1401* (2013.01); *H05K 7/1488* (2013.01)

(58) Field of Classification Search
USPC ..... 361/679.43, 679.57, 726, 727, 740, 747, 361/754, 759, 801
See application file for complete search history.

(56) References Cited

U.S. PATENT DOCUMENTS

| | | |
|---|---|---|
| 6,927,975 B2 | 8/2005 | Crippen et al. |
| 6,939,319 B1 | 9/2005 | Anstead et al. |
| 6,956,745 B2 * | 10/2005 | Kerrigan .............. H05K 7/1489 312/223.1 |
| 7,499,271 B2 | 3/2009 | Wagatsuma et al. |
| 8,416,563 B2 | 4/2013 | Hou |
| 9,152,189 B2 | 10/2015 | Fan |
| 2004/0008497 A1 | 1/2004 | Barringer et al. |
| 2004/0264146 A1 * | 12/2004 | Kerrigan .............. H05K 7/1489 361/726 |
| 2008/0117603 A1 * | 5/2008 | Henry ................. H05K 7/1409 361/740 |
| 2011/0304247 A1 | 12/2011 | Yan et al. |
| 2012/0213577 A1 * | 8/2012 | Fan ........................ G06F 1/187 403/327 |
| 2016/0081215 A1 * | 3/2016 | Boretti ................. H05K 7/183 248/221.11 |

OTHER PUBLICATIONS

International Business Machines Corporation, U.S. Appl. No. 14/588,214, filed Dec. 31, 2014, 34 pages.
International Business Machines Corporation, U.S. Appl. No. 14/602,009, filed Jan. 21, 2015, 34 pages.
International Business Machines Corporation, U.S. Appl. No. 14/576,272, filed Dec. 19, 2014, 28 pages.
International Business Machines Corporation, U.S. Appl. No. 14/586,441, filed Dec. 30, 2014, 26 pages.

* cited by examiner

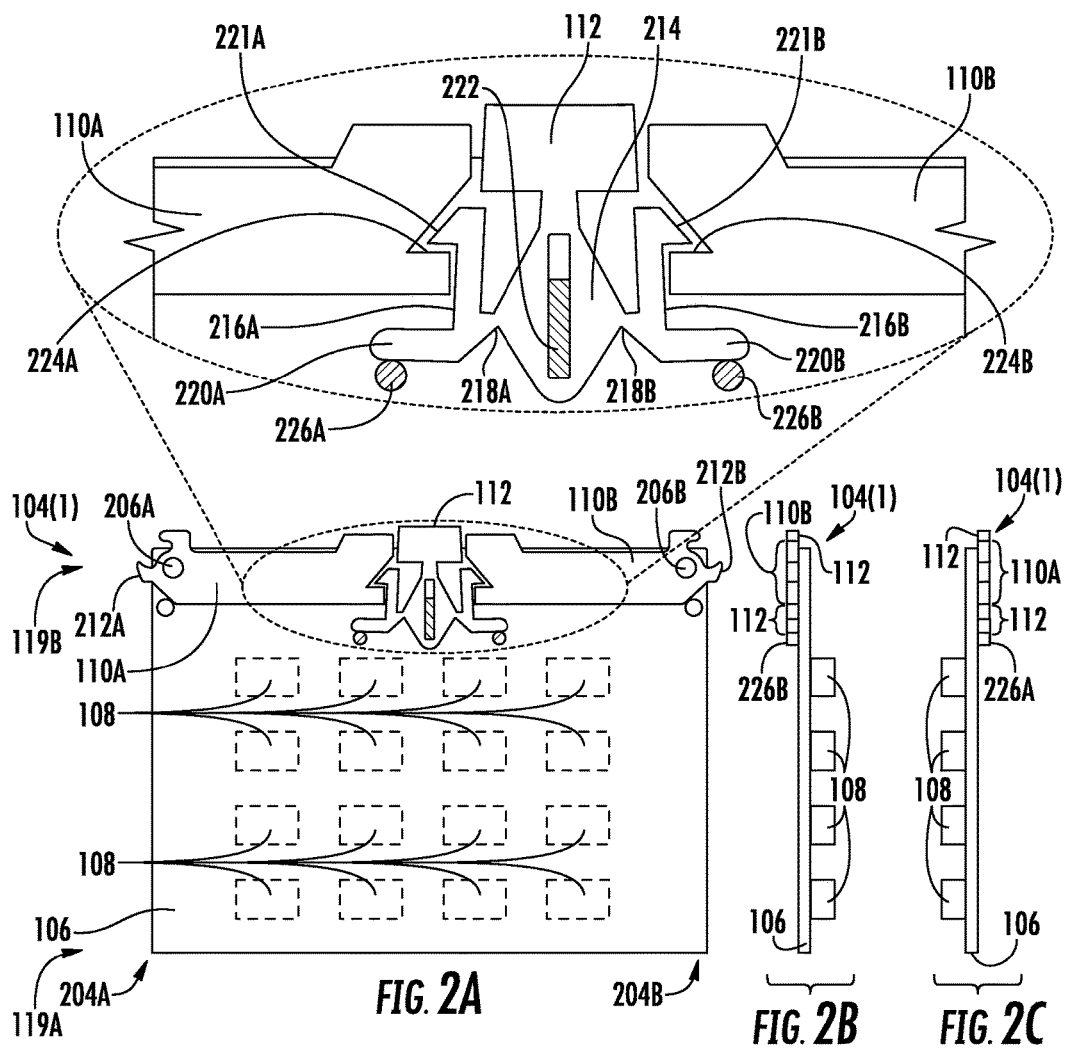
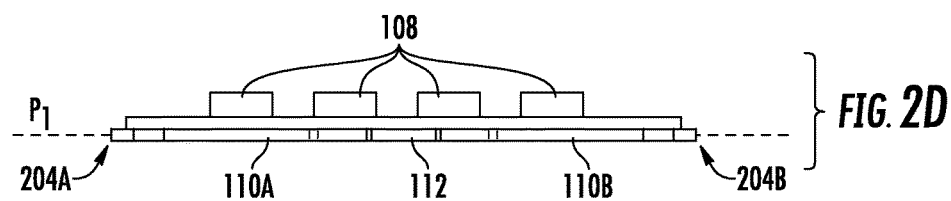
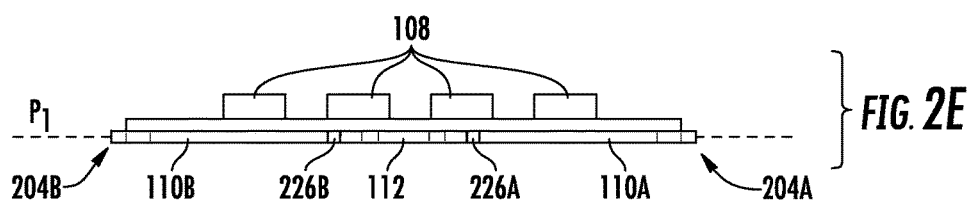

MODULAR ELEMENTS EMPLOYING LATCHES WITH FLEXURE BEARINGS

BACKGROUND

The present disclosure relates to enclosure systems having removable equipment elements, and in particular, to electronic components supported by elements which are removable from enclosures.

TECHNICAL BACKGROUND

Benefits of enclosures include an establishment of an internal volume that provides protection and organization of the contents therein. In some applications, enclosures form a structural framework and protection of internal volumes, for example, from electromagnetic radiation, humidity, moisture, and heat. Items to be disposed within the internal volumes of enclosures may be supported as part of modular elements which are secured to the structural framework of the enclosure during use. The structural framework also precisely positions and holds firmly the modular elements, so that the internal volume may be precisely populated to optimize cooling flow, resist vibration, maximize storage capacity, and/or provide convenient interfaces for modular elements to be efficiently replaced ("swapped out") by personnel without damage when maintenance and/or upgrades are required.

As technology improves, demands to reduce cost while simultaneously increasing performance continues, and there is an increasing need to populate enclosures with higher densities of components within enclosures to reduce the footprints of data centers and improve the speed of electronic components by decreasing the distances therebetween. With the resultantly highly-populated enclosures it is becoming more challenging to identify available volume within enclosures to route supply power cables and cooling air for components. Structural components of the enclosure and latching systems to secure the modular units to the enclosure are physically occupying spatial volume that could be occupied for additional electronic components or pathways for cooling air, communication cables, or power cords to support additional components in the enclosure. New approaches are needed to reliably secure modular units within enclosures while occupying minimum volume, and enabling efficient upgrades and maintenance.

SUMMARY

Embodiments disclosed herein include modular elements employing latches with flexure bearings. A modular element may include a chassis body supporting electronic components. The body is in communication with a latch and a control body of a control member of the modular element. The modular element is removable from or secured to an enclosure using the latch. The latch may engage the enclosure and may remain engaged with the enclosure by being temporarily secured by interfacing with a control catch of a control arm of the control member. By connecting the control arm to the control body with a living hinge, the living hinge may urge the control catch into a detent of the latch to secure the latch and keep the modular element secured to the enclosure. The latch may be disengaged from the control member by removing the control catch from the detent. In this manner, the modular element is efficiently secured and removed from the enclosure with minimum obstruction to airflow provided to the electronic components.

According to one embodiment of the present invention, a modular element is disclosed. The modular element is removable from an enclosure during an unlocked mode and secured in enclosure during a locked mode. The modular element includes a chassis body supporting electronic components. The modular element further includes at least one latch in pivotable communication with the chassis body and configured to be engaged with the enclosure during the locked mode. The modular element also includes a control member including a control body in slidable communication with the chassis body. The control member is in slidable communication between a first position during the locked mode and a second position during the unlocked mode. The control member also includes at least one control arm connected to the control body by at least one living hinge of the control member. Upon movement of the control body to the first position, the at least one living hinge secures the at least one latch by urging a control catch of the at least one control arm within a detent of the at least one latch. In this manner, the modular element may efficiently be secured and removed from the enclosure to enable hot swapping of electronic components for maintenance or upgrades.

According to one embodiment of the present invention, a method for securing and removing a modular element within an enclosure is disclosed. The method includes disposing at least a portion of a chassis body of the modular element within the enclosure. The chassis body supporting electronic components. The modular element includes at least one latch in pivoting communication with the chassis body and a control body of a control member in slidable communication with the chassis body. The method further includes securing the chassis body within the enclosure by moving the latch with respect to the chassis body to engage the at last one latch with the enclosure. The method also includes pivoting the at least one latch with respect to the chassis body by applying an installation force to the at least one latch to dispose a detent of the at least one latch adjacent to a control catch of a control arm of the control member. The method also includes securing the at least one latch with respect to the chassis body by urging the control catch into the detent with a living hinge of the control member. The living hinge connects the control arm to the control body. In this manner, the modular element may efficiently be secured and removed from the enclosure with a reduced spatial volume enabling additional electronic components to populate the enclosure.

According to one embodiment of the present invention, an electronic device is disclosed. The electronic device includes an enclosure. The electronic device also includes a modular element removable from the enclosure. The modular element includes at least one latch in pivotable communication with the chassis body and configured to be engaged with the enclosure during the locked mode. The modular element further includes a control member including a control body in slidable communication with the chassis body between a first position during the locked mode and a second position during the unlocked mode. The control member also includes at least one control arm connected to the control body by at least one living hinge of the control member. Upon movement of the control body to the first position, the at least one living hinge secures the at least one latch by urging a control catch of the at least one control arm within a detent of the at least one latch. The control member includes at least one push member extending from the control arm and in communication with a respective protrusion extending from the chassis body. Upon application of a disengagement force to the control member, the control body of the control member is configured to move to the second position and the respective protrusion resists the movement of the push member by flexing the living hinge and disengaging the control catch of the at least one control arm from the detent. In this manner, a high flow of airflow can be supplied to the electronic components in the enclosure with the small volume occupied by the control member and latch.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A through 2G are a bottom view, right side view, left side view, front view, rear view, bottom perspective view, and bottom perspective exploded view of an exemplary one of the modular elements of FIG. 1;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include modular elements employing latches and control members with flexure bearings securable within enclosures. A modular element may include a chassis body supporting electronic components. The body is in communication with a latch and a control body of a control member of the modular element. The modular element is removable from or secured to an enclosure using the latch. The latch may engage the enclosure and may remain engaged with the enclosure by being secured by interfacing with a control catch of a control arm of the control member. The control arm is flexibly connected to the control body by the flexure bearing which, in one embodiment, may be a living hinge. The living hinge has sufficient rigidity so as to be self-biased toward a neutral position, but may be urged away from the neutral position by application of an appropriate disengagement force to the control member. In the neutral position (or while being biased toward the neutral position), the living hinge urges the control catch into a detent of the latch to secure the latch and keep the modular element secured to the enclosure. Applying the disengagement force to the control member overcomes the self-bias of the living hinge and causes the control catch to be removed from the detent, thereby disengaging the latch. In this manner, the modular element is efficiently secured and removed from the enclosure with minimum obstruction to airflow to the electronic components.

Figure 1:
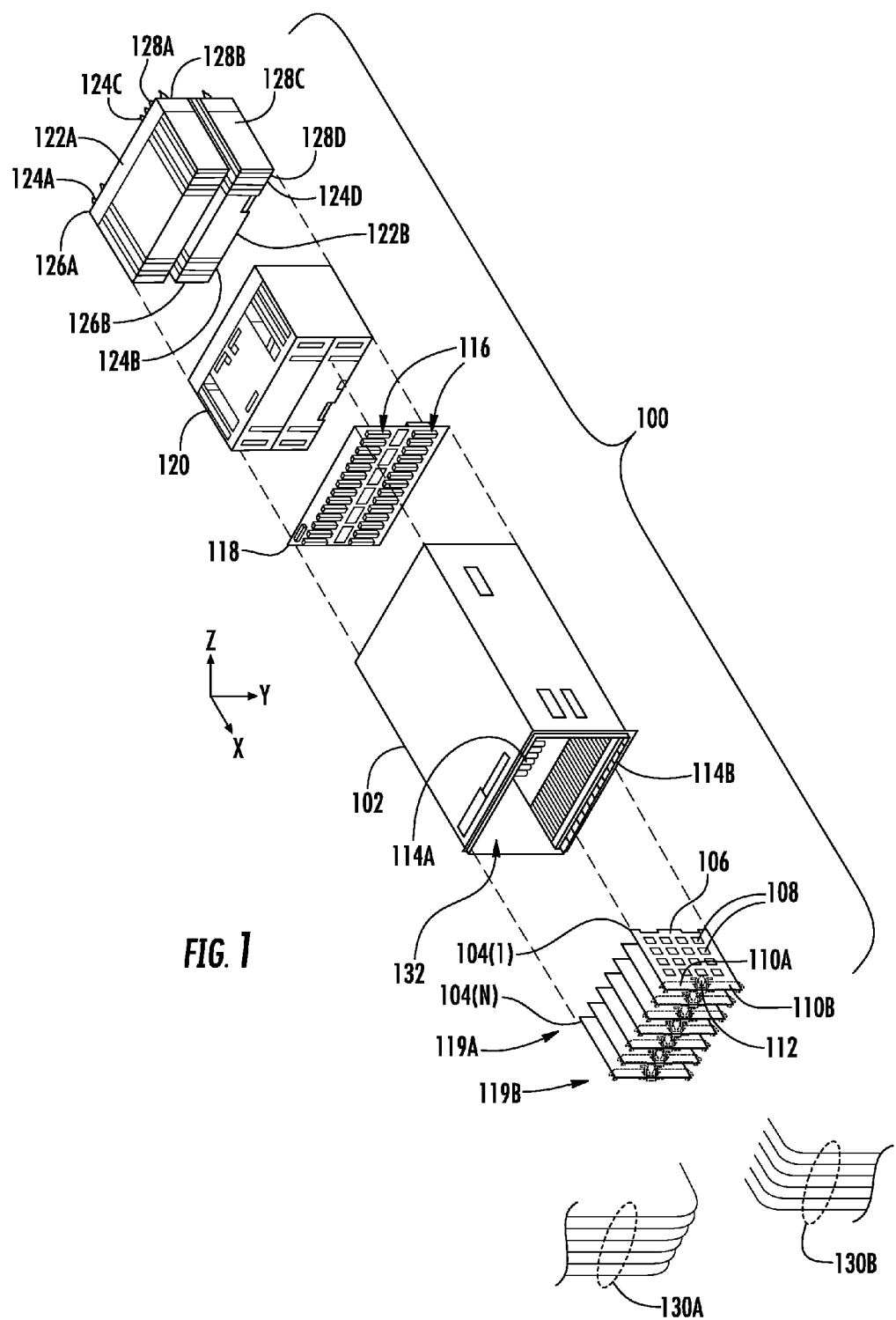
FIG. 1 is a top perspective exploded view of an exemplary electronic device including an enclosure and removable modular elements, wherein the modular elements each include a chassis body supporting electronic components, at least one latch, and a control member.
Figure 2F:
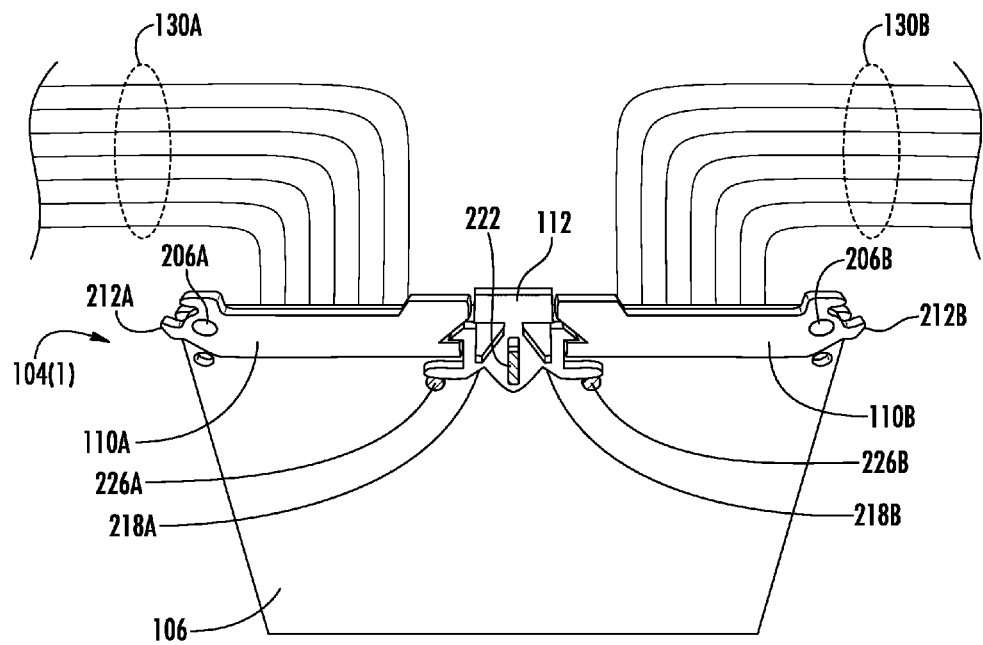
Figure 2G:
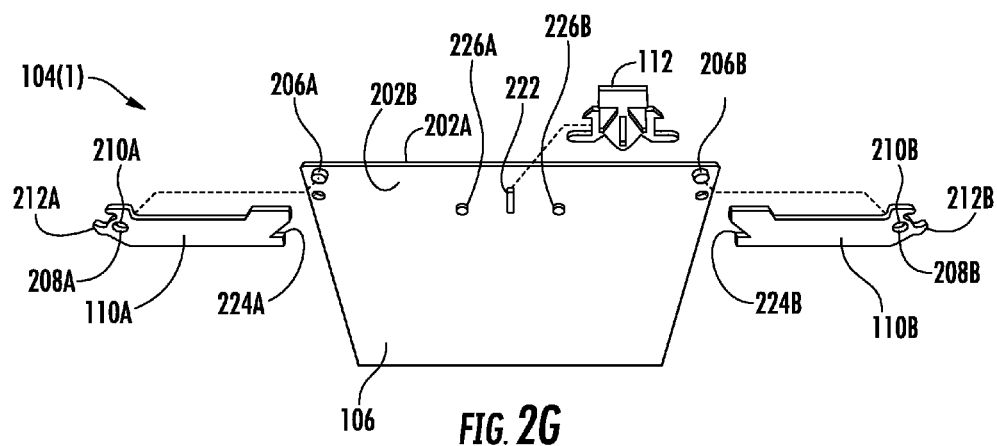

FIG. 1 is a top perspective exploded view of an exemplary electronic device 100 including an enclosure 102 and removable modular elements 104(1)-104(N) which may be individually installed and later removed from the enclosure 102. Each of the removable modular elements 104(1)-104 (N) includes a chassis body 106 supporting electronic components 108, at least one latch 110A, 110B, and control member 112. As discussed in more detail below, the latches 110A, 110B may engage at least one receptor 114A, 114B of the enclosure 102 to secure the respective one of the modular element 104(1)-104(N) within the enclosure 102. The control member 112 includes a control body in communication with the chassis body and a control arm connected to the control body by at least one living hinge of the control member 112 (as discussed later relative to FIG. 2B) to secure the latches 110A, 110B and maintain the respective modular element 104(1) secured to the enclosure 102. A disengagement force F2 (FIG. 4B) may be applied to the control member 112 to enable the latches 110A, 110B to disengage from the enclosure 102. In this manner, each of the modular elements 104(1)-104(N) may be removably secured to the enclosure 102.

The electronic components 108 may be supported to respective ones of the chassis bodies 106 of the modular elements 104(1)-104(N). The electronic components 108 may, for example, include semiconductor-based processor and/or semiconductor-based storage components. When the modular elements 104(1)-104(N) are secured in the enclosure 102, the electronic components 108 of the modular elements 104(1)-14(N) may also be coupled (not shown) at the back 119A of the modular elements 104(1)-104(N) to connector slots 116 of a midplane 118. The connector slots 116 may include power and a signal interfaces for the electronic components 108 to function and exchange information with a second chassis 120. The second chassis 120 may contain various hot plug-able components for cooling, power, control, and switching. The second chassis may slide to and latch onto the chassis 102. The second chassis 120 may contain hot plug-able blowers 122A, 122B include backward-curved impeller blowers and provide redundant cooling to various components of the electronic device 100. Airflow may be directed from the front to the rear of the second chassis 120. Each of the modular elements 104(1)-104(N) may includes a front grille to admit air, and low-profile vapor chamber based heat sinks to cool the electronic components 108. In one example, the total airflow through the electronic device 100s may be approximately 300 CFM at a 0.7 inch H2O static pressure drop.

With continued reference to FIG. 1, the electronic device 100 may also include power modules 124A-124D, management modules 126A, 126B, and switch modules 128A-128D. The power modules 124A-124D provide operating voltages for the electronic components 108. The management modules 126A, 126B may provide basic management functions, for example, controlling, monitoring, alerting, restarting, and diagnostics. The management modules 126A, 126B may have separate communications links (e.g. Ethernet) to the switch modules 128A-128D providing communications with the electronic components 108. In addition, communication cable groups 130A, 130B may be connected at a front 119B of the modular elements 104(1)-104(N). In this manner, power, communication, and environmental cooling may be provided to the electronic components 108 of the modular elements 104(1)-104(N).

FIGS. 2A through 2G are a bottom view, right side view, left side view, front view, rear view, bottom perspective view, and bottom perspective exploded view of the module element 104(1) of the modular elements 104(1)-104(N) of FIG. 1. In this regard, the module element 104(1) includes the chassis body 106, the at least one latch 110A, 110B, and the control member 112. Each of these will now be discussed sequentially and in reference to the FIGS. 2A through 2G.

The chassis body 106 supports the electronic components 108 and serves as the structural foundation for each of the modular elements 140(1)-140(N). The chassis body 106 includes a first side 202A and a second side 202B opposite the first side 202A. The electronic components 108 may be attached to the first side 202A, second side 202B and/or within the chassis body 106. The first side 202A and the second side 202B extend from the front 119B to the back 119A of the modular element 104(1) and from a left side 204A of the modular element 104(1) to a right side 204B of the modular element 104(1). The chassis body 106 may comprise a strong material, for example, plastic, metal, or composites to prevent bending which may cause unwanted contact between adjacent modular elements 104(2)-104(N) and/or undesirable transient changes in cooling air passageways along the first side 202A and the second side 202B of the modular element 104(1). In this manner, the left side 204A and the right side 204B of the chassis body 106 are configured to be adjacent to or interface with the enclosure 102 to maximize the size of the modular element 104(1) for a given size of enclosure 102.

The chassis body 106 may provide electrical interconnection and may comprise a circuit board or other electronic interconnecting structure to provide power and intercommunication with the electronic components 108 supported thereon. The electronic devices 108 may be supported from one or more of the first side 202A and the second side 202B. In some cases the electronic devices 108 may be supported on an opposite side of the chassis body 106 from where the control member 112 and the latches 110A, 110B communicate with the chassis body 106. In this manner, movement of the control member 112 and the latches 110A, 110B may be unimpeded by a presence of the electronic devices 108 on the opposite side of the chassis body 106.

With continued reference to FIGS. 2A through 2G, the latches 110A, 110B removably secure the chassis body 106 to the enclosure 102. The latches 110A, 110B respectively include catch portions 212A, 212B which are configured to be secured to the enclosure 102 by interfacing with the receptors 114A, 114B of the enclosure 102. The receptors 114A, 114B of the enclosure 102 may comprise holes or cavities within the enclosure 102 where when the catch portions 212A, 212B may be received. Once received, the receptors 114A, 114B prevent the latch 110A, 110B and the chassis body 106 attached to the latches 110A, 110B from being removed from the enclosure 102 until the catch portions 212A, 212B disengages from the receptors 114A, 114B.

The latches 110A, 110B are in pivotable communication with the chassis body 106. The pivotable communication may be created by spindles 206A, 206B which extend from the chassis body 106 and interface with inner surfaces 208A, 208B of the latches 110A, 110B. The inner surfaces 208A, 208B form respective holes 210A, 210B of the latches 110A, 110B. The latches 110A, 110B may pivot relative to the chassis body 106 as the spindles 206A, 206B interface with the inner surfaces 208A, 208B. The modular element 104(1) is moved along a direction X (see FIG. 1) to be disposed in the enclosure 102 and in a suitable position to be secured within the enclosure 102. In order to secure the chassis body 106 within the enclosure 102, the at least one latch 110, 110B may pivot relative to the chassis body 106, so that the catch portion 212A, 212B of the at least one latch 110A, 110B moves at least partially parallel in the Y-direction and into the receptors 114A, 114B of the enclosure 102. The pivoting of the latches 110A, 110B may occur by applying an installation force F1 to each of the latches 110A, 110B as depicted in FIG. 2A.

While the catch portion 212A, 212B of the latches 110A, 110B remain disposed within the receptors 114A, 114B of the enclosure 102, the receptors 114A, 114B restrict movement of the catch portions 212A, 212B of the latches 110A, 110B in the X-direction. As long as the latches 110A, 110B remain stationary relative to the chassis body 106, the catch portions 212A, 212B of the latches 110A, 110B remain engaged in the receptors 114A, 114B of the enclosure 102 and the modular element 104(1) will be prevented from movement in the X-direction out of the opening 132 (FIG. 1) of the enclosure 102. The enclosure 102 may prevent movement of the chassis body 106 parallel to the Y-direction. In this manner, the latches 110A, 110B removably secure the modular element 104(1) within the enclosure 102 and place the modular element 104(1) in a locked mode.

The control member 112 secures the latches 110A, 110B engaged with the receptors 114A, 114B of the enclosure 102 while in the locked mode. The control member 112 includes a control body 214, at least one control arm 216A, 216B, at least one living hinge 218A, 218B, at least one push member 220A, 220B, and at least one control catch 221A, 221B. The control body 214 is in slidable communication with the chassis body 106 and may include a linear slide 222 to enable movement of the control body 214 between a first position 223A and a second position 223B. In this regard, the control member 112 is in the first position 223A during a locked mode when the modular element 104(1) is secured to the enclosure 102 and in the second position 223B during the unlocked mode when the latches 110A, 110B are mobilized and able to disengage from the enclosure 102. The control body 214 may receive the disengagement force F2 (as discussed later in FIG. 4B) to enable the user to mobilize the latches 110A, 110B. The linear slide 222 may facilitate movement of the control body 214 to be parallel to a direction, for example the X-direction depicted in FIG. 1, in which the modular element 104 is urged into and removed from the enclosure 102. In this manner, the control body 214 may be easily accessible to the user at the front 119B (FIG. 1) of the modular element 104(1), and also the movement of the control body 214 is symmetric to the latches 110A, 110B enabling similar operation of the latches 110A, 110B on the left 204A and the right side 204B (FIG. 2A) of the modular element 104(1) to more equally distribute the loads on the enclosure 102 to reduce maintenance.

The control arms 216A, 216B are connected to the control body 214 by the living hinges 218A, 218B. The living hinges 218A, 218B enable the control arms 216A, 216B to move, for example pivot, relative to the control body 214. The living hinges 218A, 218B may comprise a strong resilient material, for example, plastic, metal or aluminum. The control arms 216A, 216B include the control catches 221A, 221B, for example in the shape of a protruding lip, which are configured to be received within detents 224A, 224B of the latches 110A, 110B. The living hinges 218A, 218B may have sufficient rigidity so as to be self-biased toward a neutral position and when moving to the neutral position may urge the control catches 221A, 221B into the detents 224A, 224B when the control catches 221A, 221B are disposed adjacent to the detents 224A, 224B. The levers 110A, 110B are secured and unable to disengage from the enclosure 102 when the control catches 221A, 221B are received in the detents 224A, 224B of the latches 110A, 110B. In this manner, the modular element 104(1) may be secured to the enclosure 102 in a locked mode as the latches 110A, 110B remain secured with the catch portions 212A, 212B engaged in the receptors 114A, 114B of the enclosure 102 and the modular element 104(1) prevented from movement in the X-direction out of the opening 132 of the enclosure 102.

With continued reference to FIGS. 2A through 2G, several components of the modular element 104(1) work together to enable the unlocked mode where the modular element 104(1) may be removed from the enclosure 102. In this regard, the living hinges 218A, 218B operate in cooperation with the push members 220A, 220B, and protrusions 226A, 226B of the chassis body 106 to disengage the control catches 221A, 221B of the control arms 216A, 216B from the detents 224A, 224B. In one example, disengagement force F2 may be applied to the control body 214 to move the control body 214 along the linear slide 222. The protrusions 226A, 226B resist the movement of the push members 220A, 220B by flexing the living hinges 218A, 218B in a direction away from the neutral position of the living hinges 218A, 218B to remove or disengage the control catches 221A, 221B from the detents 224A, 224B of the latches 110A, 110B. In this manner, the latches 110A, 110B become free to move about the latch spindles 206A, 206B and disengage the catch portions 212A, 212B from the enclosure 102 to enable the modular element 104(1) to be removed from the enclosure 102. The modular elements 104(2)-104(N) may operate in a similar manner as modular element 104(1).

It is noted that the control body 214, the control arms 216A, 216B, the push members 220A, 220B, and the latches 110A, 110B of the modular element 104(1) may be disposed and/or move within a geometric plane P1 (see FIGS. 2D and 2E). This co-planar arrangement and movement has several benefits. Cooling airflow provided to the electronic components 108 may be increased as the control body 214, the control arms 216A, 216B, the push members 220A, 220B, and the latches 110A, 110B of the modular element 104(1) may be disposed adjacent to the chassis body 106. This adjacent arrangement provides minimal obstruction to the airflow (not shown) which may be directed parallel to the first side 202A and/or a second side 202B of the chassis body 106. Also, the control body 214, the control arms 216A, 216B, the push members 220A, 220B, and the latches 110A, 110B may be made lighter and more compact to accommodate co-planar movements and forces within the geometric plane P1 and avoid more complex and/or unnecessary structure. The complex structure which has been avoided would be needed to accommodate movements and/or forces outside of the geometric plane P1. In this manner, the modular element 104(1) may more efficiently provide cooling to the electrical components 108 and reduce costs.

Figure 3:
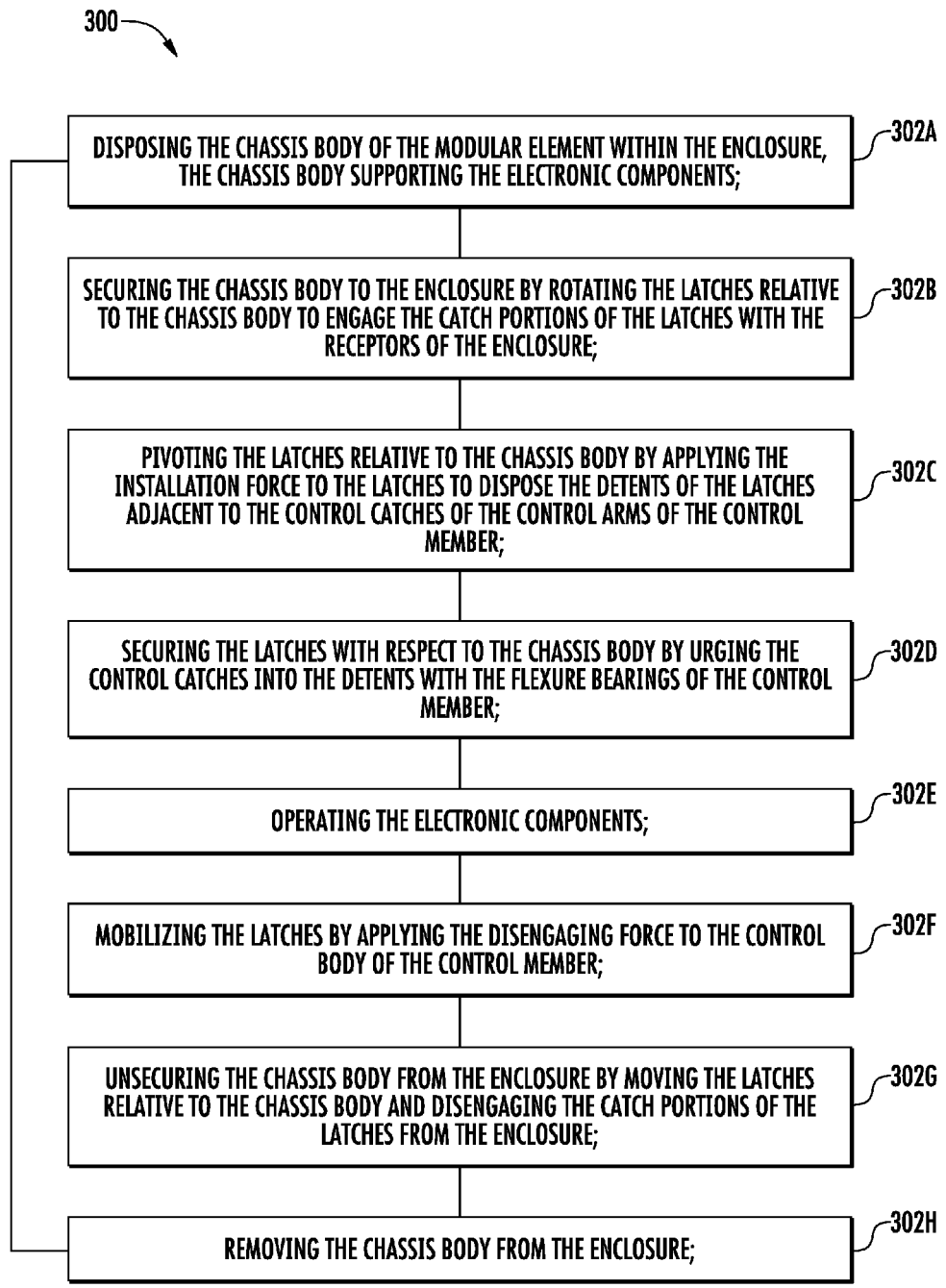
FIG. 3 is a flowchart of an exemplary method for securing the modular element of FIG. 2A within the enclosure of FIG. 1 before removing the modular element.

FIG. 3 is a flowchart of an exemplary method 300 for securing the modular element 104(1) of FIG. 2A within the enclosure 102 of FIG. 1 and removing the modular element 104(1) from the enclosure 102. The method 300 is now discussed using the terminology discussed above in relation to the operations 302A-302H as depicted in FIG. 3. In this regard, the method 300 includes disposing at least a portion of a chassis body 106 of the modular element 104(1) within the enclosure 102, wherein the chassis body 106 supports electronic components 108 (operation 302A of FIG. 3). The modular element 104(1) includes the latches 110A, 110B in pivoting communication with the chassis body 106 and the control body 214 of the control member 112 in slidable communication with the chassis body 106. The method 300 also includes securing the chassis body 106 within the enclosure 102 by moving the latches 110A, 110B with respect to the chassis body 106 and engaging the catch portions 212A, 212B of the latches 110A, 110B with the enclosure 102 (operation 302B of FIG. 3).

Figure 4A:
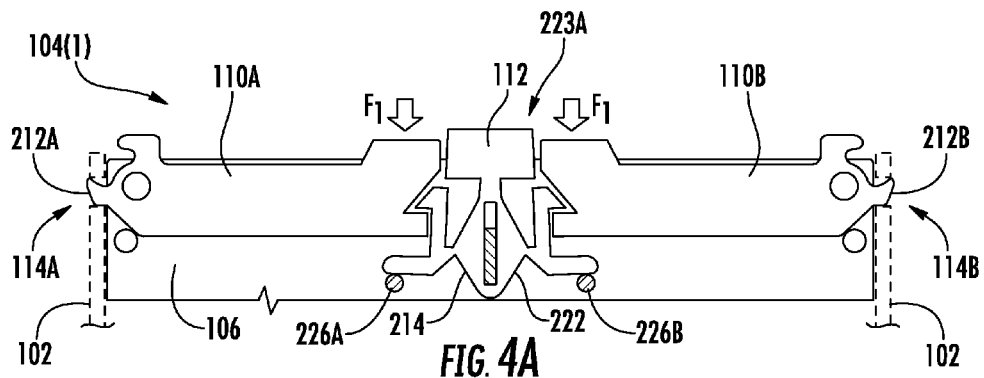
FIG. 4A is a bottom view of the modular element of FIG. 2A being secured to receptors of the enclosure and the at least one latch of the modular element being secured in the lock mode by the control member.

As shown in FIG. 4A, the method 300 also includes pivoting the latches 110A, 110B with respect to the chassis body 106 by applying the installation force F1 to the latches 110A, 110B to dispose the detents 224A, 224B of the latches 110A, 110B adjacent to the control catches 221A, 221B of the control arms 216A, 216B of the control member 112 (operation 302C of FIG. 3). The method 300 also includes securing the latches 110A, 110B with respect to the chassis body 106 by urging the control catches 221A, 221B into the detents 224A, 224B with the living hinges 218A, 218B of the control member 112 (operation 302D of FIG. 3). The living hinges 218A, 218B connect the control arms 216A, 216B to the control body 214. In this manner, the modular element 104(1) may be secured in a locked mode.

Figure 4B:
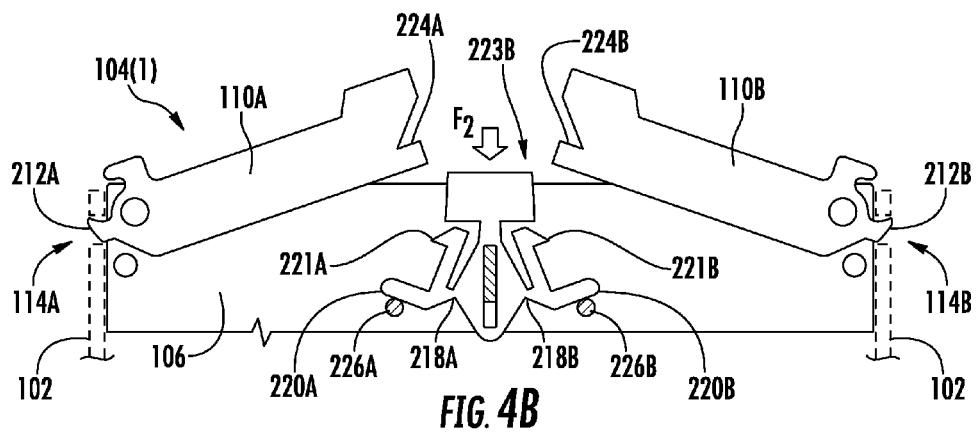
FIG. 4B is a bottom view of the modular element of FIG. 4A illustrating a disengagement force being applied to the control member of the modular element to mobilize the at least one latch.

The method 300 may also include operating the electronic components supported on the chassis body 106 (operation 302E of FIG. 3). One or more of the modular elements 104(1)-104(N) may be removed when maintenance or upgrades are required. When removal is initiated the modular elements 104(1)-104(N) are to be unsecured from the enclosure 102 to facilitate removal in the unlocked mode. In this regard, as shown in FIG. 4B, the method 300 may include mobilizing the latches 110A, 110B by applying the disengagement force F2 to the control body 214 of the control member 112 (operation 302F of FIG. 3). The disengagement force F2 moves the control body 214 along the linear slide 222. The protrusions 226A, 226B resist the movement of the push members 220A, 220B by flexing the living hinges 218A, 218B in a direction to remove or disengage the control catches 221A, 221B from the detents 224A, 224B of the latches 110A, 110B. In this manner, the latches 110A, 110B become free to move about the latch spindles 206A, 206B and disengage the catch portions 212A, 212B from the enclosure 102 to enable the modular element 104(1) to be removed from the enclosure 102.

The method 300 may also include unsecuring the chassis body 106 from the enclosure 102 by moving the latches 110A, 110B with respect to the chassis body 106 and disengaging the catch portions 212A, 212B of the latches 110A, 110B from the enclosure 102 (operation 302G of FIG. 3).

Figure 4C:
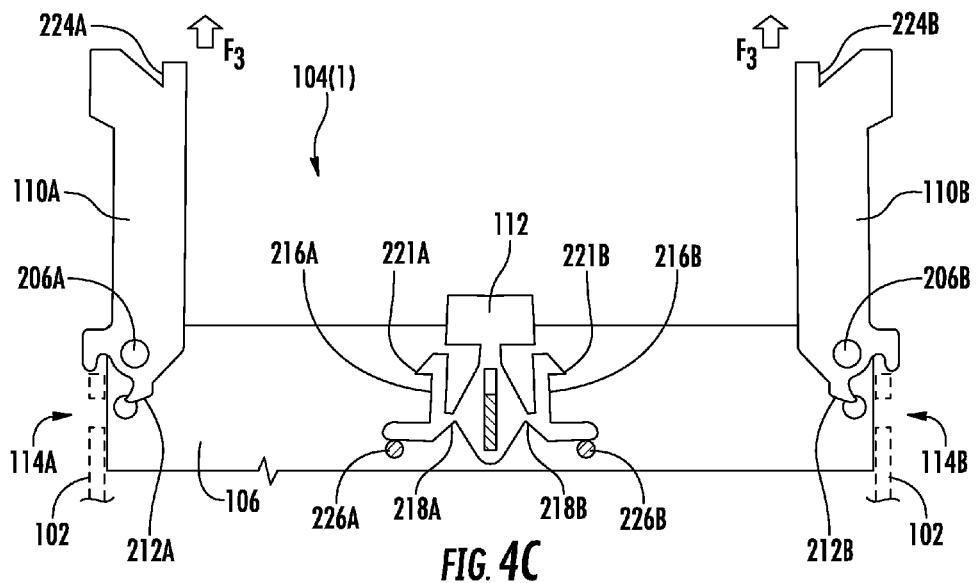
FIG. 4C is a bottom view of the modular element of FIG. 4B illustrating removing the modular element from the enclosure by applying a removal force to the at least one latch.

As depicted in FIG. 4C, the method may also include removing the modular element 104(1) from the enclosure 102 with an application of a removal force F3 to the latches 110A, 110B (operation 302H of FIG. 3). The modular element 104(1) may in some cases slide along a rail (not shown) of the enclosure 102 as the removal force F3 is applied. In this manner, the modular element 104(1) may be removed from the enclosure 102.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A modular element removable from an enclosure during an unlocked mode and secured in the enclosure during a locked mode, the modular element comprises:
   a chassis body supporting electronic components;
   at least one latch in pivotable communication with the chassis body and configured to be engaged with the enclosure during the locked mode; and
   a control member including a control body in slidable communication with the chassis body between a first position during the locked mode and a second position during the unlocked mode, the control member also includes:
      at least one control arm connected to the control body by at least one living hinge of the control member; and
      at least one push member extending from the control arm and in communication with a respective protrusion extending from the chassis body, wherein the at least one control arm extends from the living hinge in a first direction, and wherein the at least one push member extends from the control arm in a second direction away from the control body, wherein the first direction is different from the second direction;
   wherein upon movement of the control body to the first position, the at least one living hinge secures the at least one latch by urging a control catch of the at least one control arm within a detent of the at least one latch, and wherein upon application of a disengagement force to the control member, the control body of the control member is urged to the second position and the respective protrusion resists the movement of the at least one push member by flexing the living hinge and disengaging the control catch of the at least one control arm from the detent.

2. The modular element of claim 1, wherein the control body, the at least one control arm, and the at least one push member, and the at least one latch move within a geometric plane.

3. The modular element of claim 1, wherein the living hinge comprises plastic, metal or aluminum.

4. The modular element of claim 1, wherein when in the unlocked mode the at least one latch is configured to receive an installation force to rotate the at least one latch relative to the chassis body and place the detent of the at least one latch proximate to the control catch of the at least one control arm.

5. The modular element of claim 1, wherein the at least one latch communicates with the chassis body through at least one spindle configured to provide relative rotational motion therebetween.

6. The modular element of claim 5, wherein the spindles comprise cylindrically-shaped protrusions extending from the chassis body and interfacing with circular-shaped holes of the at least one latch.

7. The modular element of claim 1, wherein the modular element includes a linear slide to connect the control body to the chassis body and enable the control body to move linearly between the first position and the second position.

8. The modular element of claim 1, wherein the electronic components include at least one of: semiconductor-based information storage devices, semiconductor-based processor devices, electrical connectors, and fiber optic connectors.

9. The modular element of claim 1, wherein the chassis body includes a first side and a second side opposite of the first side, wherein the electronic components are disposed at the first side and the at least one latch, and the control member are disposed on the second side.

10. The modular element of claim 1, wherein the at least one living hinge includes a neutral position which is disposed to urge the control catch of the at least one control arm within the detent when the control catch is adjacent to the detent.

11. The modular element of claim 1, wherein the at least one living hinge includes a neutral position and is urged away from the neutral position and disengages the control catch from the detent by the application of the disengagement force to the control member.

12. An electronic device, comprising:
an enclosure;
a modular element removable from the enclosure, wherein the modular element includes:
a chassis body supporting electronic components;
at least one latch in pivotable communication with the chassis body and configured to be engaged with the enclosure during the locked mode; and
a control member including a control body in slidable communication with the chassis body between a first position during the locked mode and a second position during the unlocked mode, the control member also includes at least one control arm connected to the control body by at least one living hinge of the control member,
wherein upon movement of the control body to the first position, the at least one living hinge secures the at least one latch by urging a control catch of the at least one control arm within a detent of the at least one latch,
wherein the control member includes at least one push member extending from the control arm and in communication with a respective protrusion extending from the chassis body, wherein the at least one control arm extends from the living hinge in a first direction, and wherein the at least one push member extends from the control arm in a second direction away from the control body, wherein the first direction is different from the second direction, and
wherein upon application of a disengagement force to the control member, the control body of the control member is urged to the second position and the respective protrusion resists the movement of the push member by flexing the living hinge and disengaging the control catch of the at least one control arm from the detent.

13. The electronic device of claim 12, wherein the control body, the at least one control arm, and the at least one push member, and the at least one latch move within a geometric plane.

14. The electronic device of claim 12, wherein the living hinge comprises plastic, metal or aluminum.

15. The electronic device of claim 12, wherein when in the unlocked mode the at least one latch is configured to receive an installation force to rotate the at least one latch relative to the chassis body and place the detent of the at least one latch proximate to the control catch of the at least one control arm.

16. The electronic device of claim 12, wherein the modular element includes a linear slide to connect the control body to the chassis body and enable the control body to move linearly between the first position and the second position.

17. The electronic device of claim 12, wherein the at least one latch communicates with the chassis body through at least one spindle configured to provide relative rotational motion therebetween.

18. The electronic device of claim 17, wherein the spindles comprise cylindrically-shaped protrusions extending from the chassis body and interfacing with circular-shaped holes of the at least one latch.

* * * * *